(12) United States Patent
Soo et al.

(10) Patent No.: US 10,921,352 B2
(45) Date of Patent: Feb. 16, 2021

(54) PRECISION CURRENT SENSING USING LOW COST SENSE RESISTANCE

(71) Applicant: Chrontel Inc., San Jose, CA (US)

(72) Inventors: David Chee-Fai Soo, Fremont, CA (US); Mohammad Yunus, Tracy, CA (US); Yiwei Wang, Fremont, CA (US)

(73) Assignee: Chrontel Inc., San Jose, CA (US)

( * ) Notice: Subject to any disclaimer, the term of this patent is extended or adjusted under 35 U.S.C. 154(b) by 80 days.

(21) Appl. No.: 16/398,237

(22) Filed: Apr. 29, 2019

(65) Prior Publication Data

US 2019/0377012 A1 Dec. 12, 2019

Related U.S. Application Data

(60) Provisional application No. 62/682,621, filed on Jun. 8, 2018.

(51) Int. Cl.
*G01R 19/25* (2006.01)
*G01R 1/20* (2006.01)

(52) U.S. Cl.
CPC ............ *G01R 19/25* (2013.01); *G01R 1/203* (2013.01)

(58) Field of Classification Search
CPC ... G01R 1/203; G01R 15/146; G01R 19/0007
See application file for complete search history.

(56) References Cited

U.S. PATENT DOCUMENTS

| 2005/0024035 A1* | 2/2005 | Tabaian | H02M 3/1584 323/315 |
| 2013/0116955 A1* | 5/2013 | Williams | G01R 15/20 702/64 |

* cited by examiner

*Primary Examiner* — Tung X Nguyen
(74) *Attorney, Agent, or Firm* — Ellenoff Grossman & Schole LLP; James M. Smedley; Alex Korona (57) ABSTRACT

Apparatus and associated methods relate to configuring a circuit to sense current in a low-cost non-precision resistance, calibrating the circuit to correct inaccuracy measured in the sensed current, and measuring with the corrected circuit the precise current sensed in the low-cost non-precision resistance. In an illustrative example, the low-cost non-precision resistance may be a metal trace on a printed circuit board. The circuit may be calibrated, for example, over a range of currents or temperatures, permitting automatic adjustment to a wide range of non-precision resistance parameter values and environmental conditions. In some examples, correcting coefficients may be adapted to compensate for resistance non-linearities, which may include skin effect or self-heating. Some embodiments may verify the calibrated correction over a range of current and temperature. Various examples may advantageously provide high precision measurement at reduced cost, based on calibrating a circuit to obtain corrected measurement sensed with a low-cost non-precision resistance.

18 Claims, 5 Drawing Sheets

PRECISION CURRENT SENSING USING LOW COST SENSE RESISTANCE

CROSS REFERENCE TO RELATED APPLICATIONS

This application claims the benefit of U.S. Provisional Application No. 62/682,621, titled "PRECISION CURRENT SENSING USING LOW COST SENSE RESISTANCE," filed on 8 Jun. 2018 by Applicants: David Chee-Fai Soo, Yiwei Wang, Mohammad Yunus, and Wayne Kwok Wing Lo; First Named Inventor: David Chee-Fai Soo.

This application incorporates the entire contents of the above-referenced application herein by reference.

TECHNICAL FIELD

Various embodiments relate generally to current sensing.

BACKGROUND

Current sensing is an electric current measurement technique. Electric current is a flow of electric charge. A battery may be a source of electric charge. Some electronic devices may be battery-powered. In some scenarios, battery-powered electronic equipment may require current sensing for Coulomb counting, to evaluate the battery condition, for over and under current limit monitoring, or for battery management functions. Some batteries require precision control and monitoring.

In some examples, current may be indirectly measured. For example, electric charge flow through a two-terminal resistive element produces an electric potential known as a voltage drop across the resistive element. In some examples of circuits with a resistive element, the voltage drop across the resistive element will be a function of the resistance and the current. In an illustrative example, the current in such a circuit may be sensed based on measuring the voltage drop across a resistance of known value.

In some practical examples, resistive elements having precisely known resistance values may be very costly. If the resistance varies, the accuracy of the voltage and the current measurement will also vary. Some resistive elements change value over time, or as the ambient temperature changes. In some scenarios, a resistive element's resistance value may be non-linear with respect to variation in circuit conditions. In an illustrative example, a low-cost sense resistor may have a non-linear resistance due to skin effect for higher values of current, or due to self-heating.

SUMMARY

Apparatus and associated methods relate to configuring a circuit to sense current in a low-cost non-precision resistance, calibrating the circuit to correct inaccuracy measured in the sensed current, and measuring with the corrected circuit the precise current sensed in the low-cost non-precision resistance. In an illustrative example, the low-cost non-precision resistance may be a metal trace on a printed circuit board. The circuit may be calibrated, for example, over a range of currents or temperatures, permitting automatic adjustment to a wide range of non-precision resistance parameter values and environmental conditions. In some examples, correcting coefficients may be adapted to compensate for resistance non-linearities, which may include skin effect or self-heating. Some embodiments may verify the calibrated correction over a range of current and temperature. Various examples may advantageously provide high precision measurement at reduced cost, based on calibrating a circuit to obtain corrected measurement sensed with a low-cost non-precision resistance.

Various embodiments may achieve one or more advantages. For example, some embodiments may reduce the cost of precision current measurement. Such reduced cost precision current measurement may be a result of calibrating a circuit to obtain corrected measurement sensed with a low-cost non-precision resistance. In some embodiments, precision current measurements may be obtained even in the presence of variable environmental conditions. This facilitation may be a result of automatically calibrating a current sensing circuit over a range of currents or temperatures. Some examples may increase the availability of precision current measurement. Such increased access to precision current measurement may be a result of calibrating a current sensing circuit to correct for non-precision resistance parameter values and environmental conditions. Some embodiments may increase the availability of materials useful in current sensing as low-cost non-precision resistance elements. This facilitation may be a result of automatically adjusting the measurement circuit to correct for sense resistor non-linearity. Various embodiments may increase current measurement precision. Such increased precision of current measurement may be a result of measurements based on longer test times, more current values, or more temperature settings.

The details of various embodiments are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION OF ILLUSTRATIVE EMBODIMENTS

To aid understanding, this document is organized as follows. First, illustrative precision current sensing embodiment designs are briefly introduced with reference to FIG. 1. Second, with reference to FIG. 2, the discussion turns to exemplary embodiments that illustrate design of a metal trace configured in a substrate for precision voltage drop measurement. Specifically, the substrate may be a printed circuit board, or other material suitable to electrical equipment. Then, with reference to FIG. 3, an illustrative design of an exemplary metal trace configured on a lead frame or integrated circuit for precision voltage drop measurement is described. Then, with reference to FIG. 4, an exemplary design illustrating the use of bond wire configured in an integrated circuit for precision voltage drop measurement is disclosed. Finally, with reference to FIG. 5, an illustrative process flow performed by an exemplary precision current measuring system to calibrate current sensing is disclosed.

Figure 1:
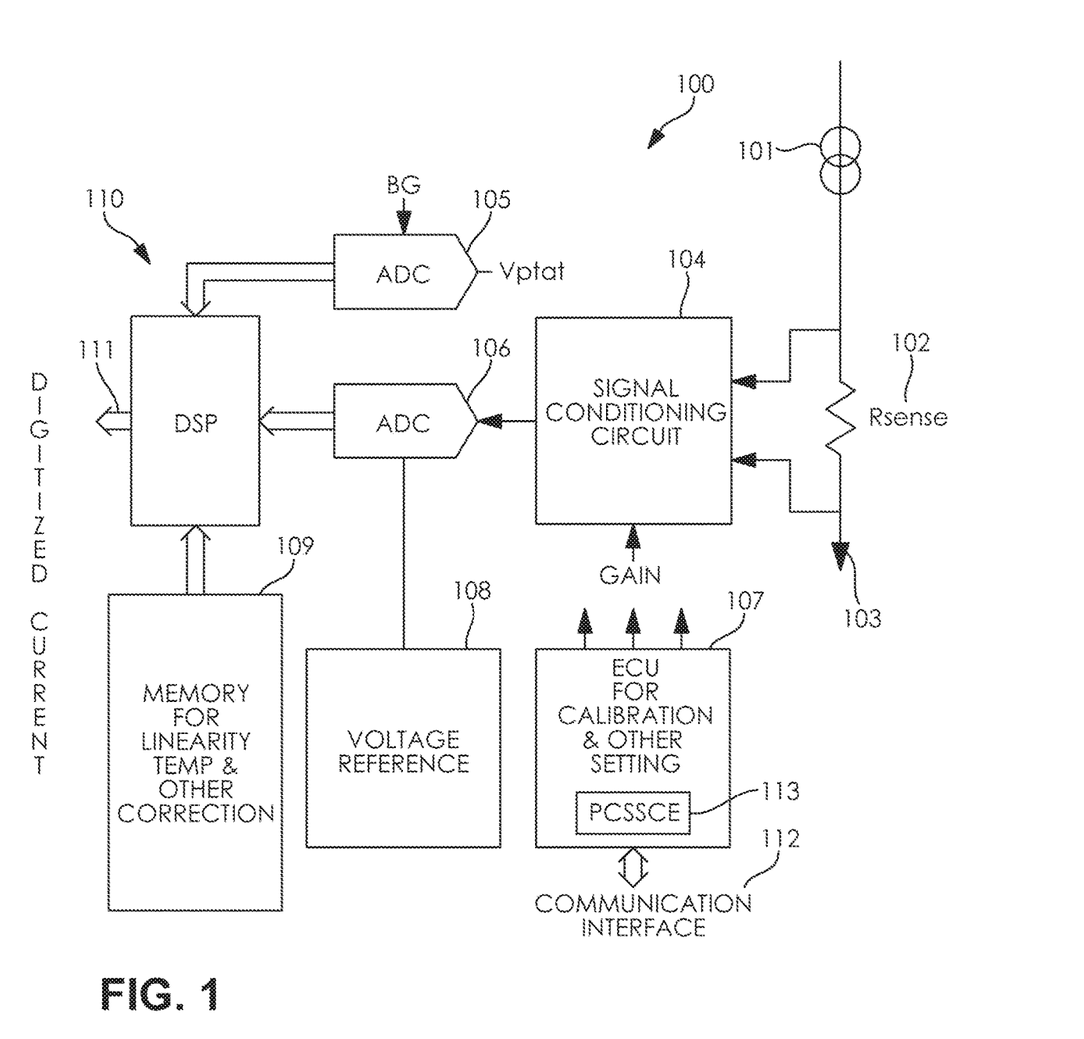
FIG. 1 depicts an exemplary precision current sensing system having a circuit configured to sense current in a low-cost non-precision resistance, correct inaccuracy measured in the sensed current based on calibrating the circuit, and measure with the corrected circuit the precise current sensed in the low-cost non-precision resistance.

FIG. 1 depicts an exemplary precision current sensing system having a circuit configured to sense current in a low-cost non-precision resistance, correct inaccuracy measured in the sensed current based on calibrating the circuit, and measure with the corrected circuit the precise current sensed in the low-cost non-precision resistance. In FIG. 1, the depicted embodiment precision current sensing system 100 includes current source or current supply 101 connected in series with resistor 102 to facilitate sensing the current delivered by the current source 101. In the illustrated embodiment, the resistor 102 is connected at a first side of the resistor 102 to the current source 101 and at a second side of the resistor 102 to the circuit ground 103. In the depicted embodiment, the resistor 102 is illustrated configured in low side current sensing mode. In some embodiments, the resistor 102 may be configured in a high side current sensing mode. In the illustrated embodiment, the signal conditioning circuit block 104 is electrically connected to both the resistor 102 first side node proximal to the current supply 101, and the resistor 102 second side node proximal to the circuit ground 103, to sense the voltage drop across the resistor 102. In the depicted embodiment, the signal conditioning circuit block 104 takes the difference of the voltage sensed at the resistor 102 first side node and the resistor 102 second side node, and amplifies, if needed, difference of the voltage sensed, for the analog to digital converter (ADC) 106. In some embodiments, the functions of the signal conditioning circuit block 104 and the ADC 106 may be combined in one block. In the illustrated embodiment, the ADC 106 is operably coupled with the voltage reference 108. In the depicted embodiment, ambient temperature may be digitized by the ADC 105 using on chip voltage proportional to temperature (VPTAT) against the bandgap reference (BG). In the illustrated embodiment, the depicted VPTAT and BG are connected to the ADC 105. Some embodiments may be configured with a low-cost temperature sensor, such as a bipolar diode with a known temperature coefficient (typically −2 mV/C). In the illustrated embodiment, signals digitized by the depicted ADC 105 and ADC 106 are fed to the digital signal processing block 110 to compute the precision digitized current value 111 using co-efficient data from the memory 109. In the depicted embodiment, the memory 109 includes co-efficient data adapted to configure correction to linearity, temperature, and other non-idealities. In some embodiments, one or more co-efficient used to compute the precision digitized current value 111 may be computed during a calibration process. In the illustrated embodiment, the signal processing and calibration is controlled by the electronic control unit (ECU) 107. In the depicted embodiment, the ECU 107 includes a processor (CPU) with access to processor-executable program instructions configured to control the signal processing and calibration. In the depicted embodiment, the processor-executable program instructions governing the ECU 107 signal processing and calibration control are encoded in a memory accessible to the ECU 107 processor. In the illustrated embodiment, the processor-executable program instructions encoded in the memory accessible to the ECU 107 processor include processor-executable program instructions configured to implement the illustrated Precision Current Sensing System Calibration Engine (PCSSCE) 113 executing as program instructions on the processor (CPU) included in the ECU 107. In the depicted example, the ECU 107 is operably and communicatively coupled with the depicted elements. In some embodiments, the ECU 107 may govern various settings, or control functions other than, or in addition to, signal processing and calibration. In the depicted embodiment, the ECU 107 is configured with communication interface 112. In some embodiments, the ECU 107 communication interface 112 may be USB type C, or any other standard digital interface. In an illustrative example, because temperature in some scenarios may change slowly, some embodiments may save hardware based on an implementation having one ADC instead of two. In such a single-ADC embodiment, ADC cycles may be stolen periodically, to digitize the temperature; however, the ADC would digitize the current sense resistor 102 voltage most of the time.

Figure 2:
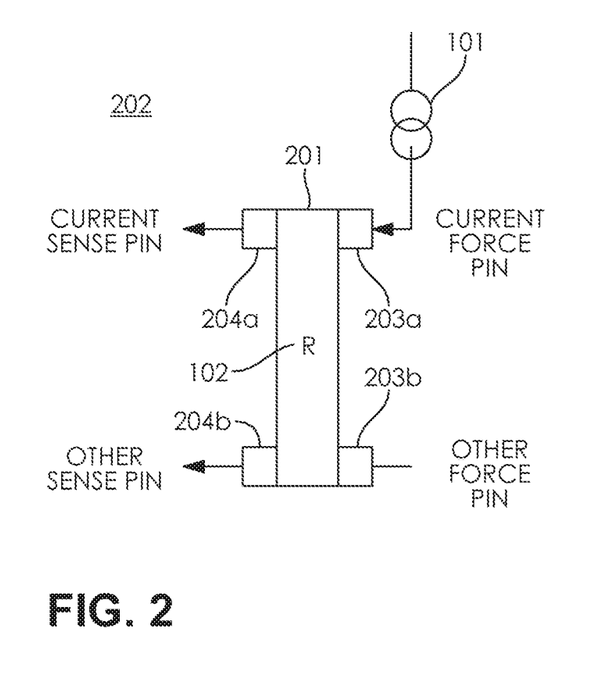
FIG. 2 depicts an exemplary metal trace configured for precision current sensing in a printed circuit board with force and sense pins.

FIG. 2 depicts an exemplary metal trace configured for precision current sensing in a printed circuit board with force and sense pins. In FIG. 2, the depicted exemplary metal trace 201 is illustrated on a printed circuit board (PCB) 202 with force pins 203a, 203b, and sense pins 204a, 204b. In the illustrated embodiment, the force pin 203a is illustrated in an exemplary current force pin configuration. In the depicted embodiment, the force pin 203b is illustrated in an exemplary other force pin configuration. In the depicted embodiment, the resistance 102 of the illustrated PCB-trace 201 design is configured to facilitate sensing the current delivered by the current supply 101. In various embodiments, the substrate may not be limited to a printed circuit board design. For example, in some embodiments, the substrate may be ceramic, or any other substrate suitable in electrical equipment. In the depicted embodiment, the resistance 102 value of the illustrated metal trace 201 is based on the length, width and sheet resistance of the material. In an illustrative example, layout may be carefully designed and implemented to substantially ensure contact resistance is not a significant part of the sense resistance. Force and sense node design techniques for precision voltage drop measurement are well known in the art, and well understood and practiced by industry.

Figure 3:
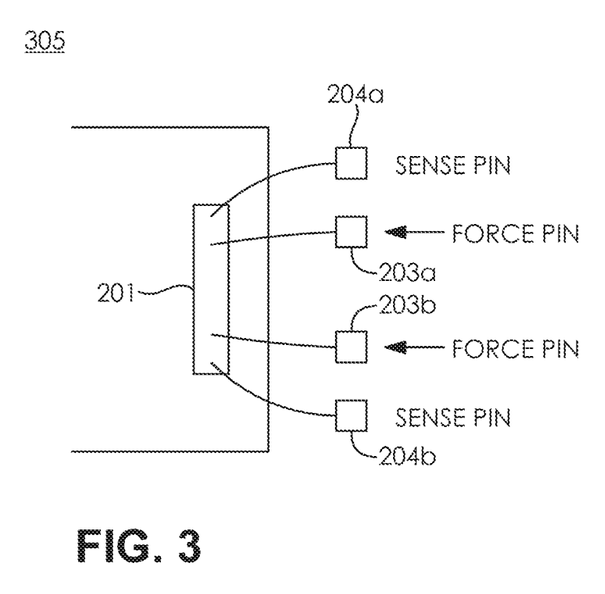
FIG. 3 depicts an exemplary metal trace configured for precision current sensing in a lead frame or integrated circuit.

FIG. 3 depicts an exemplary metal trace configured for precision current sensing in a lead frame or integrated circuit. In FIG. 3, the depicted exemplary metal trace 201 is illustrated configured on the lead frame 305. In the illustrated embodiment, the exemplary metal trace 201 is configured with the force pins 203a, 203b, and the sense pins 204a, 204b. In some embodiments, the illustrated exemplary metal trace 201 may be configured on an integrated circuit. In various examples, the integrated circuit may be substantially silicon. In some designs, the integrated circuit may include silicon. In some embodiments, the integrated circuit may not be substantially silicon. In various implementations, the integrated circuit may not include silicon. In an illustrative example, layout may be carefully designed and implemented along with force and sense nodes to sense voltage drop accurately, as described for FIG. 2.

Figure 4:
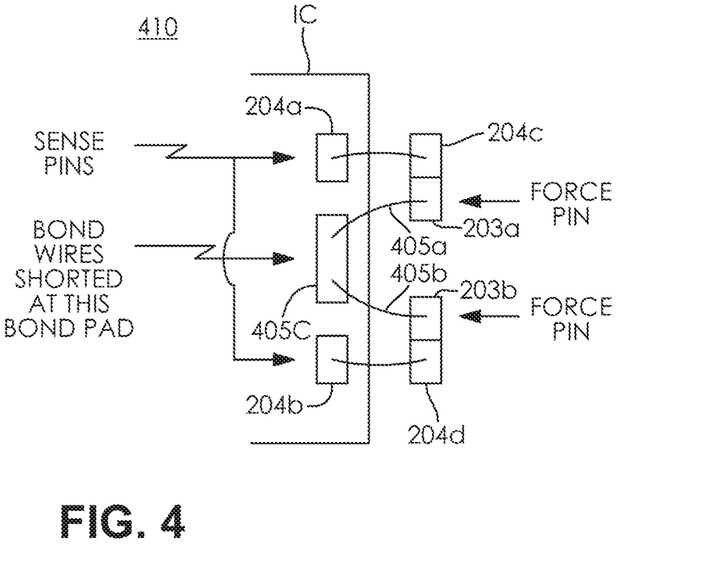
FIG. 4 depicts an exemplary bond wire configured for precision current sensing in an integrated circuit.

FIG. 4 depicts an exemplary bond wire configured for precision current sensing in an integrated circuit. In the embodiment depicted by FIG. 4, the illustrated metal bond wires 405a, 405b are depicted shorted on the bond pad 405c in an exemplary integrated circuit (IC) package 410 sense resistor configuration that includes the force pins 203a, 203b shorted to the pins 204c, 204d. In the illustrated embodiment, the pins 204c, 204d are bonded to the sense pads 204a, 204b. In some embodiments, other circuitry may be configured in the integrated circuit package 410, or in a system in a package. In the depicted embodiment, the sense pads 204a, 204b are connected to signal conditioning circuitry on the IC 410. In an illustrative example, the value of the sense resistance is a function of the diameters of the bond wires 405a, 405b, the length of the bond wires 405a, 405b, and the material of the bond wires 405a, 405b, plus a small resistance of the bond pad 405c where both bond wires 405a, 405b are shorted. In the depicted embodiment, the bond pads 204a, 405c, and 204b are on the IC, and the pins 204c, 203a, 203b, and 204d are on the lead frame of the IC package. In some embodiments, the pins 204c, 203a, 203b, and 204d may be on the substrate if the IC die is bonded directly to any other substrate.

Figure 5:
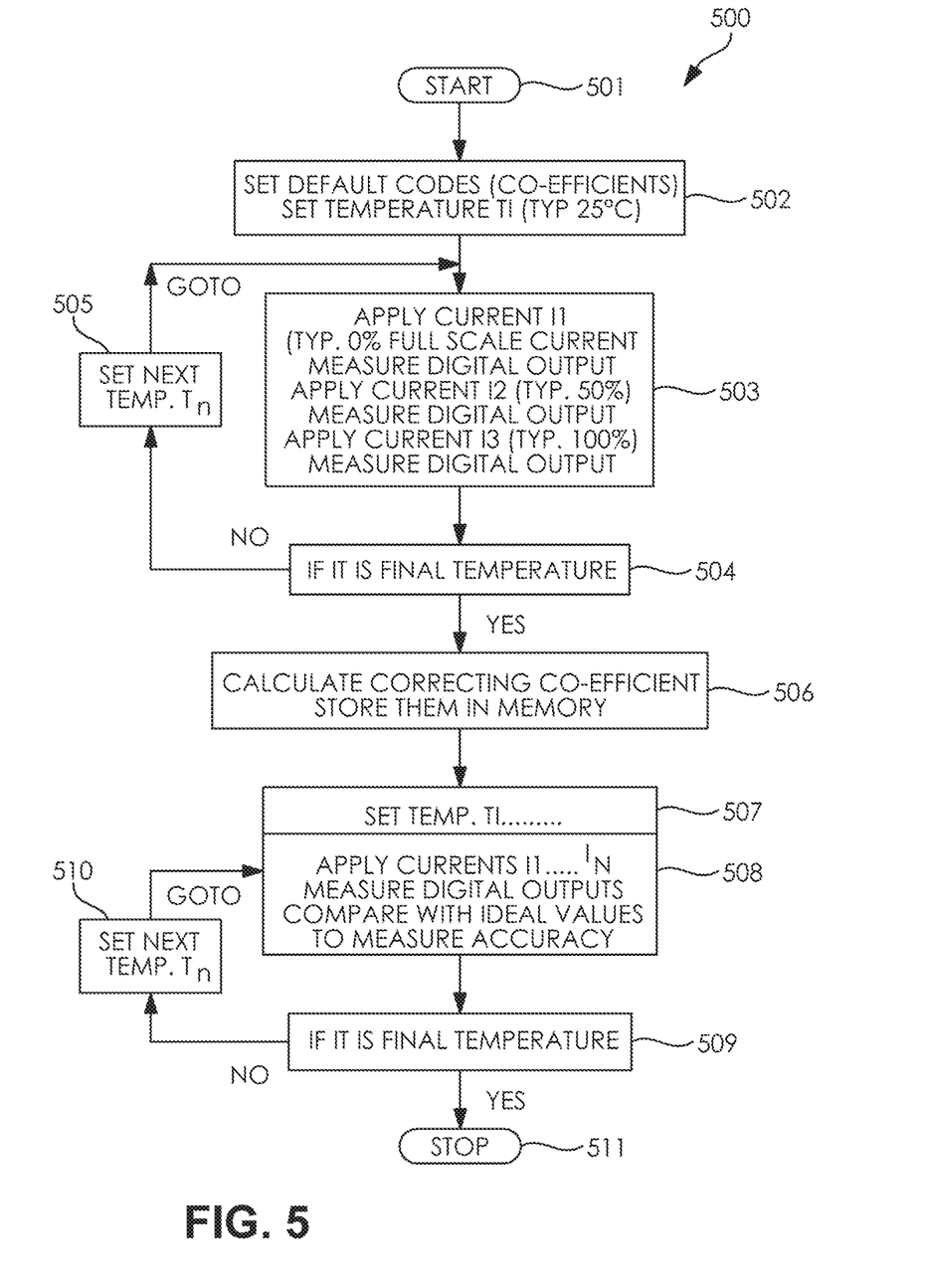
FIG. 5 depicts an illustrative process flow to calibrate current sensing by an exemplary precision current measuring system.

FIG. 5 depicts an illustrative process flow to calibrate current sensing by an exemplary precision current measuring system. In FIG. 5, the depicted calibration process illustrates example steps to calibrate an exemplary precision current measuring system. In various embodiments, some steps of the exemplary process depicted by FIG. 5 may be simplified using statistical data to reduce cost of the calibration. The method 500 depicted in FIG. 5 is given from the perspective of a Precision Current Sensing System Calibration Engine (PCSSCE) 113 executing as program instructions on the processor (CPU) included in the ECU 107, depicted in FIG. 1. In the illustrated embodiment, the PCSSCE 113 executes as program instructions on the ECU 107 processor configured in the precision current sensing system 100, depicted in FIG. 1. In some embodiments, the PCSSCE 113 may execute as a cloud service communicatively and operably coupled with system services, hardware resources, or software elements local to and/or external to the precision current sensing system 100. In various implementations, the PCSSCE 113 may execute as a cloud service communicatively coupled via the ECU 107 communication interface 112 with system services, hardware resources, or software elements local to and/or external to the precision current sensing system 100. In various embodiments, the PCSSCE 113 may execute as program instructions on the DSP 110 configured in the precision current sensing system 100, depicted in FIG. 1.

The depicted method 500 begins at step 501.

The method continues at step 502 with the ECU 107 processor setting default codes (coefficients) and setting temperature $T_1$. In some embodiments the temperature $T_1$ may be set to 25° C. In the depicted embodiment, the ECU 107 processor sets up default codes or correcting coefficients associated with various calibration parameters. For example, default settings configured at step 502 may include coefficients representing default values for calibration parameters such as, for example: offset (value with zero current) as zero, gain as one, gain linearity correction 1, offset temperature coefficient as zero, gain & linearity temperature co-efficient as zero. In various embodiments, raw values of the sensed voltage may appear as a digital number representing the digitized current 111 at the DSP 110, depicted in FIG. 1. In some embodiments, the raw values of the sensed voltage may be read by the communication interface 112, depicted in FIG. 1.

The method continues at step 503 with the ECU 107 processor performing the following operations: 1) Apply current $I_1$ (in some embodiments, the current $I_1$ may be applied as 0% full scale current); 2) Measure digital output; 3) Apply current $I_2$. In some embodiments, the current $I_2$ may be applied as 50% full scale current); 4) Measure digital output; 5) Apply current $I_3$ (in some embodiments, the current $I_3$ may be applied as 100% full scale current); and, 6) measure digital output. In the depicted embodiment, the signal processing is illustrated at step 503 with different values of the accurate forced current through the sensed resistor. In some embodiments, typical values of these currents are 0%, 50% & 100% of the sensed current range. In the depicted example, the digitized values may be read through the communication interface 112. In the depicted embodiment, the ECU 107 processor repeats the step 503 processing for temperatures of −40° C. and 125° C. In some embodiments, the ECU 107 processor may repeat the step 503 processing for other temperatures, or for a range of temperatures.

In the illustrated embodiment, the ECU 107 processor computes nine data points covering three temperatures and three currents. In various embodiments, the ECU 107 processor may compute the offset correction, or the offset correction for linear and non-linear characteristics of the offset over temperature, as a function of the data points covering the temperatures. In an illustrative example, the ECU 107 processor may compute gain correction, or gain correction for linear and non-linear characteristics of the gain over temperature, as a function of the data points covering the temperatures. In some embodiments, the ECU 107 processor may replace the set of default coefficients in the memory with correction coefficients computed by the ECU 107 processor. In an illustrative example, signal processing may be performed by the ECU 107 processor or the DSP 110 to verify the correction of the sensed voltage of the sense resistor over various values of the accurate forced current as well as over various temperatures. The accuracy in various implementations may be within the typical expected value of digital numbers directly proportional to the forced current. These accuracies may be typically about 0.1%. Higher accuracy is possible in some embodiments, with longer test times using more than three current values and more than three temperature settings.

The method continues at step 504 with the ECU 107 processor performing a test to determine if the final temperature has been obtained.

Upon a determination by the ECU 107 processor at step 504 the final temperature has not been obtained, the method continues at step 505 with the ECU 107 processor setting the next temperature $T_n$, and the method continues at step 503.

Upon a determination by the ECU 107 processor at step 504 the final temperature has been reached, the method continues at step 506 with the ECU 107 processor calculating correcting coefficients and storing them in memory.

The method continues at step 507 with the ECU 107 processor setting each temperature from $T_1$ to $T_n$ iteratively for each pass in step 507, beginning with $T_1$. Each pass after setting the next temperature $T_n$, the method continues at step 508, with the ECU 107 processor applying each current from $I_1$ to $I_n$ iteratively, beginning with $I_1$, for each pass in step 508. Each pass after applying the next current $I_n$, the method at step 508 also measures the digital outputs and compares the measured digital outputs with ideal values to measure accuracy.

The method continues at step 509 with the ECU 107 processor performing a test to determine if the final temperature has been obtained. Upon a determination by the ECU 107 processor at step 509 the final temperature has not been obtained, the method continues at step 510 with the ECU 107 processor setting the next temperature $T_n$, and the method continues at step 508.

Upon a determination by the ECU 107 processor at step 509 the final temperature has been obtained, the method ends at step 511.

In various designs, the processing steps implemented at step 503 in the embodiment depicted by FIG. 5 may be repeated for other temperatures, as an example, −40° C. & 125° C. In this illustrative example, we will have nine data points covering three temperatures. One may compute the offset correction, offset correction for linear and non-linear characteristics of the offset over temperature. Similarly, gain correction, gain correction for linear and non-linear characteristics of the gain over temperature could be computed. The correction coefficients may be placed in the memory replacing the set of default coefficients. In an illustrative example, signal processing may be performed to verify the correction of the sensed voltage of the sense resistor over various values of the accurate forced current as well as over various temperature. The accuracy in various implementations may be within the typical expected value of digital numbers directly proportional to the forced current. These accuracies will be typically about 0.1%. Higher accuracy is possible in some embodiments, with longer test times using more than three current values and more than three temperature settings.

In various implementations, the process depicted by FIG. 5 may calibrate sensing of the current by providing an accurate current while doing the calibration. In some embodiments, the calibration process may be performed over temperature to enhance the accuracy of the current measurement. In an illustrative example, the exemplary calibration process illustrated by FIG. 5 provides an advantageous result such that non-idealities of the circuitry that are doing the signal conditioning, and providing voltage references, are also zeroed out along with non-idealities of the low-cost sense resistor over process variations, temperature variation and any variation due to the value of the current itself.

Although various embodiments have been described with reference to the Figures, other embodiments are possible. For example, some embodiments may use a non-precision resistive trace or wire bond to replace the expensive precision resistors from an exemplary prior-art current sensing circuit. Various embodiments may implement precision current sensing using a low-cost metal trace on printed circuit board or lead frame, or on chip, or even bond wires used in the IC assembly. In some embodiments, precision measurement may be obtained by a circuit that calibrates the sensing over current values and over a wide variation of ambient temperature. In various implementations, non-linearity of the low-cost sense resistor due to skin effect for higher values of current, self-heating, or due to the material used, may also be corrected.

In various illustrative scenarios exemplary of prior art usage, current sensing may be implemented using costly precision 0.01 or 0.02 ohms resistors in Coulomb counting in various electrical machines such as, for example, personal computers, laptops, or cell phones. Such exemplary current sensing may also be needed in USB type C power delivery circuitry especially for battery charging circuits. In an illustrative example, availability of USB type C power delivery systems opens opportunities to do several precision monitoring functions in the battery itself while being used in the field. In some exemplary scenarios illustrative of prior art usage, electronic equipment that uses battery power may require current sensing for Coulomb counting, over and under current sensing and battery management functions. In various examples, a large number of batteries, especially lithium batteries, may require precision control and monitoring functions.

In the Summary above and in this Detailed Description, and the Claims below, and in the accompanying drawings, reference is made to particular features of various embodiments of the invention. It is to be understood that the disclosure of embodiments of the invention in this specification includes all possible combinations of such particular features. For example, where a particular feature is disclosed in the context of a particular aspect or embodiment of the invention, or a particular claim, that feature can also be used—to the extent possible—in combination with and/or in the context of other particular aspects and embodiments of the invention, and in the invention generally.

While multiple embodiments are disclosed, still other embodiments of the present invention will become apparent to those skilled in the art from this detailed description. The invention is capable of myriad modifications in various obvious aspects, all without departing from the spirit and scope of the present invention. Accordingly, the drawings and descriptions are to be regarded as illustrative in nature and not restrictive.

It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments.

In the present disclosure, various features may be described as being optional, for example, through the use of the verb "may;", or, through the use of any of the phrases: "in some embodiments," "in some implementations," "in some designs," "in various embodiments," "in various implementations,", "in various designs," "in an illustrative example," or "for example;" or, through the use of parentheses. For the sake of brevity and legibility, the present disclosure does not explicitly recite each and every permutation that may be obtained by choosing from the set of optional features. However, the present disclosure is to be interpreted as explicitly disclosing all such permutations. For example, a system described as having three optional features may be embodied in seven different ways, namely with just one of the three possible features, with any two of the three possible features or with all three of the three possible features.

In various embodiments. elements described herein as coupled or connected may have an effectual relationship realizable by a direct connection or indirectly with one or more other intervening elements.

In the present disclosure, the term "any" may be understood as designating any number of the respective elements, i.e. as designating one, at least one, at least two, each or all of the respective elements. Similarly, the term "any" may be understood as designating any collection(s) of the respective elements, i.e. as designating one or more collections of the respective elements, a collection comprising one, at least one, at least two, each or all of the respective elements. The respective collections need not comprise the same number of elements.

While various embodiments of the present invention have been disclosed and described in detail herein, it will be apparent to those skilled in the art that various changes may be made to the configuration, operation and form of the invention without departing from the spirit and scope thereof. In particular, it is noted that the respective features of embodiments of the invention, even those disclosed solely in combination with other features of embodiments of the invention, may be combined in any configuration excepting those readily apparent to the person skilled in the art as nonsensical. Likewise, use of the singular and plural is solely for the sake of illustration and is not to be interpreted as limiting.

In the present disclosure, all embodiments where "comprising" is used may have as alternatives "consisting essentially of," or "consisting of" In the present disclosure, any method or apparatus embodiment may be devoid of one or more process steps or components. In the present disclosure, embodiments employing negative limitations are expressly disclosed and considered a part of this disclosure.

Certain terminology and derivations thereof may be used in the present disclosure for convenience in reference only and will not be limiting. For example, words such as "upward," "downward," "left," and "right" would refer to directions in the drawings to which reference is made unless otherwise stated. Similarly, words such as "inward" and "outward" would refer to directions toward and away from, respectively, the geometric center of a device or area and designated parts thereof. References in the singular tense include the plural, and vice versa, unless otherwise noted.

The term "comprises" and grammatical equivalents thereof are used herein to mean that other components, ingredients, steps, among others, are optionally present. For example, an embodiment "comprising" (or "which comprises") components A, B and C can consist of (i.e., contain only) components A, B and C, or can contain not only components A, B, and C but also contain one or more other components.

Where reference is made herein to a method comprising two or more defined steps, the defined steps can be carried out in any order or simultaneously (except where the context excludes that possibility), and the method can include one or more other steps which are carried out before any of the defined steps, between two of the defined steps, or after all the defined steps (except where the context excludes that possibility).

The term "at least" followed by a number is used herein to denote the start of a range beginning with that number (which may be a range having an upper limit or no upper limit, depending on the variable being defined). For example, "at least 1" means 1 or more than 1. The term "at most" followed by a number (which may be a range having 1 or 0 as its lower limit, or a range having no lower limit, depending upon the variable being defined). For example, "at most 4" means 4 or less than 4, and "at most 40%" means 40% or less than 40%. When, in this specification, a range is given as "(a first number) to (a second number)" or "(a first number)-(a second number)," this means a range whose limit is the second number. For example, 25 to 100 mm means a range whose lower limit is 25 mm and upper limit is 100 mm.

Many suitable methods and corresponding materials to make each of the individual parts of embodiment apparatus are known in the art. According to an embodiment of the present invention, one or more of the parts may be formed by machining, 3D printing (also known as "additive" manufacturing), CNC machined parts (also known as "subtractive" manufacturing), and injection molding, as will be apparent to a person of ordinary skill in the art. Metals, wood, thermoplastic and thermosetting polymers, resins and elastomers as may be described herein-above may be used. Many suitable materials are known and available and can be selected and mixed depending on desired strength and flexibility, preferred manufacturing method and particular use, as will be apparent to a person of ordinary skill in the art.

Any element in a claim herein that does not explicitly state "means for" performing a specified function, or "step for" performing a specific function, is not to be interpreted as a "means" or "step" clause as specified in 35 U.S.C. § 112 (f). Specifically, any use of "step of" in the claims herein is not intended to invoke the provisions of 35 U.S.C. § 112 (f).

According to an embodiment of the present invention, the system and method may be accomplished through the use of one or more computing devices. As depicted, for example, at least in FIG. 1, one of ordinary skill in the art would appreciate that an exemplary system appropriate for use with embodiments in accordance with the present application may generally include one or more of a Central processing Unit (CPU), Random Access Memory (RAM), a storage medium (e.g., hard disk drive, solid state drive, flash memory, cloud storage), an operating system (OS), one or more application software, a display element, one or more communications means, or one or more input/output devices/means. Examples of computing devices usable with embodiments of the present invention include, but are not limited to, proprietary computing devices, personal computers, mobile computing devices, tablet PCs, mini-PCs, servers or any combination thereof. The term computing device may also describe two or more computing devices communicatively linked in a manner as to distribute and share one or more resources, such as clustered computing devices and server banks/farms. One of ordinary skill in the art would understand that any number of computing devices could be used, and embodiments of the present invention are contemplated for use with any computing device.

In various embodiments, communications means, data store(s), processor(s), or memory may interact with other components on the computing device, in order to effect the provisioning and display of various functionalities associated with the system and method detailed herein. One of ordinary skill in the art would appreciate that there are numerous configurations that could be utilized with embodiments of the present invention, and embodiments of the present invention are contemplated for use with any appropriate configuration.

According to an embodiment of the present invention, the communications means of the system may be, for instance, any means for communicating data over one or more networks or to one or more peripheral devices attached to the system. Appropriate communications means may include, but are not limited to, circuitry and control systems for providing wireless connections, wired connections, cellular connections, data port connections, Bluetooth connections, or any combination thereof. One of ordinary skill in the art would appreciate that there are numerous communications means that may be utilized with embodiments of the present invention, and embodiments of the present invention are contemplated for use with any communications means.

Throughout this disclosure and elsewhere, block diagrams and flowchart illustrations depict methods, apparatuses (i.e., systems), and computer program products. Each element of the block diagrams and flowchart illustrations, as well as each respective combination of elements in the block diagrams and flowchart illustrations, illustrates a function of the methods, apparatuses, and computer program products. Any and all such functions ("depicted functions") can be implemented by computer program instructions; by special-purpose, hardware-based computer systems; by combinations of special purpose hardware and computer instructions; by combinations of general purpose hardware and computer instructions; and so on—any and all of which may be generally referred to herein as a "circuit," "module," or "system."

While the foregoing drawings and description may set forth functional aspects of the disclosed systems, no particular arrangement of software for implementing these functional aspects should be inferred from these descriptions unless explicitly stated or otherwise clear from the context.

Each element in flowchart illustrations may depict a step, or group of steps, of a computer-implemented method. Further, each step may contain one or more sub-steps. For the purpose of illustration, these steps (as well as any and all other steps identified and described above) are presented in order. It will be understood that an embodiment can contain an alternate order of the steps adapted to a particular application of a technique disclosed herein. All such variations and modifications are intended to fall within the scope of this disclosure. The depiction and description of steps in any particular order is not intended to exclude embodiments having the steps in a different order, unless required by a particular application, explicitly stated, or otherwise clear from the context.

Traditionally, a computer program consists of a sequence of computational instructions or program instructions. It will be appreciated that a programmable apparatus (i.e., computing device) can receive such a computer program and, by processing the computational instructions thereof, produce a further technical effect.

A programmable apparatus may include one or more microprocessors, microcontrollers, embedded microcontrollers, programmable digital signal processors, programmable devices, programmable gate arrays, programmable array logic, memory devices, application specific integrated circuits, or the like, which can be suitably employed or configured to process computer program instructions, execute computer logic, store computer data, and so on. Throughout this disclosure and elsewhere a computer can include any and all suitable combinations of at least one general purpose computer, special-purpose computer, programmable data processing apparatus, processor, processor architecture, and so on.

It will be understood that a computer can include a computer-readable storage medium and that this medium may be internal or external, removable and replaceable, or fixed. It will also be understood that a computer can include a Basic Input/Output System (BIOS), firmware, an operating system, a database, or the like that can include, interface with, or support the software and hardware described herein.

Embodiments of the system as described herein are not limited to applications involving conventional computer programs or programmable apparatuses that run them. It is contemplated, for example, that embodiments of the invention as claimed herein could include an optical computer, quantum computer, analog computer, or the like.

Regardless of the type of computer program or computer involved, a computer program can be loaded onto a computer to produce a particular machine that can perform any and all of the depicted functions. This particular machine provides a means for carrying out any and all of the depicted functions.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Computer program instructions can be stored in a computer-readable memory capable of directing a computer or other programmable data processing apparatus to function in a particular manner. The instructions stored in the computer-readable memory constitute an article of manufacture including computer-readable instructions for implementing any and all of the depicted functions.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

The elements depicted in flowchart illustrations and block diagrams throughout the figures imply logical boundaries between the elements. However, according to software or hardware engineering practices, the depicted elements and the functions thereof may be implemented as parts of a monolithic software structure, as standalone software modules, or as modules that employ external routines, code, services, and so forth, or any combination of these. All such implementations are within the scope of the present disclosure.

Unless explicitly stated or otherwise clear from the context, the verbs "execute" and "process" are used interchangeably to indicate execute, process, interpret, compile, assemble, link, load, any and all combinations of the foregoing, or the like. Therefore, embodiments that execute or process computer program instructions, computer-executable code, or the like can suitably act upon the instructions or code in any and all of the ways just described.

The functions and operations presented herein are not inherently related to any particular computer or other apparatus. Various general-purpose systems may also be used with programs in accordance with the teachings herein, or it may prove convenient to construct more specialized apparatus to perform the required method steps. The required structure for a variety of these systems will be apparent to those of skill in the art, along with equivalent variations. In addition, embodiments of the invention are not described with reference to any particular programming language. It is appreciated that a variety of programming languages may be used to implement the present teachings as described herein, and any references to specific languages are provided for disclosure of enablement and best mode of embodiments of the invention. Embodiments of the invention are well suited to a wide variety of computer network systems over numerous topologies. Within this field, the configuration and management of large networks include storage devices and computers that are communicatively coupled to dissimilar computers and storage devices over a network, such as the Internet.

Reference has been made in detail to various embodiments of the present invention. While some embodiments of the invention have been described, it will be understood that possible embodiments of the invention are not limited to embodiments described. On the contrary, embodiments of the present invention are intended to cover alternatives, modifications and equivalents, which may be included within the spirit and scope of the embodiments described.

Some embodiments such as those described herein may be discussed in the general context of computer-executable instructions residing on some form of computer-usable medium, such as program modules, executed by one or more computers or other devices. Generally, program modules include routines, programs, objects, components, data structures, etc., that perform tasks or implement data types. The functionality of the program modules may be combined or distributed as desired in various embodiments.

Some portions of the detailed description herein may be presented in terms of procedures, logic blocks, processing and other symbolic representations of operations on data bits within a computer memory. Some such descriptions and representations are the means used by those skilled in the data processing arts to convey the substance of their work to others skilled in the art. In the present application, some procedures, logic blocks, processes, or the like, may be conceived as self-consistent sequences of steps or instructions leading to a desired result. In some examples, steps may be conceived as those requiring physical manipulations of physical quantities. In some examples, such quantities may take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing the terms such as "determining," "enabling," "detecting" or the like, refer to the actions and processes (e.g., flowchart of FIG. \_\_\_\_\_\_\_\_) of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

By way of example, and not limitation, computer-usable media may comprise computer storage media and communication media. Computer storage media includes volatile and nonvolatile, removable and non-removable media implemented in any method or technology for storage of information such as computer-readable instructions, data structures, program modules or other data.

Computer storage media includes, but is not limited to, random access memory (RAM), read only memory (ROM), electrically erasable programmable ROM (EEPROM), flash memory or other memory technology, compact disk ROM (CD-ROM), digital versatile disks (DVDs) or other optical storage, magnetic cassettes, magnetic tape, magnetic disk storage or other magnetic storage devices, or any other medium that can be used to store the desired information.

Communication media can embody computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, radio frequency (RF), infrared and other wireless media. Combinations of any of the above should also be included within the scope of computer-readable media.

In the detailed description herein, numerous specific details are set forth in order to provide a thorough understanding of embodiments in accordance with the present invention. However, it will be recognized by one of ordinary skill in the art that embodiments of the present invention may be practiced without these specific details. In other instances, well known methods, procedures, components, and circuits have not been described in detail as not to unnecessarily obscure aspects of embodiments of the present invention.

A number of implementations have been described. Nevertheless, it will be understood that various modifications may be made. For example, advantageous results may be achieved if the steps of the disclosed techniques were performed in a different sequence, or if components of the disclosed systems were combined in a different manner, or if the components were supplemented with other components. Accordingly, other implementations are contemplated within the scope of the following claims.

What is claimed is:

1. A process, comprising:
a method to accurately measure current in a low-cost non-precision current sense resistance, comprising:
configuring a circuit to sense current in a low-cost non-precision current sense resistance, wherein the circuit comprises a current supply connected in series with the low-cost non-precision current sense resistance;
adapting the circuit to measure a voltage drop generated by the current supply across the low-cost non-precision current sense resistance when the current supply is activated;
calibrating the circuit to correct inaccuracy measured in the sensed current; and,
measuring with the calibrated circuit the precise current sensed in the low-cost non-precision current sense resistance.

2. The method of claim 1, in which calibrating the circuit further comprises comparing the measured voltage drop with a predetermined ideal voltage drop.

3. The method of claim 1, in which calibrating the circuit further comprises measuring the voltage drop generated by a current determined as a percentage of the current supply full scale current.

4. The method of claim 3, in which calibrating the circuit further comprises measuring the voltage drop generated by the current at a plurality of temperatures.

5. The method of claim 1, in which calibrating the circuit further comprises calculating calibration coefficients determined as a function of the current sensed in the low-cost non-precision current sense resistance.

6. An apparatus, comprising:
a precision current sensing system configured to accurately measure current, comprising:
- a current sensing element;
- a current supply connected in series with the current sensing element;
- a processor, operably coupled with the current supply to govern the current supplied by the current supply; wherein, the processor is operably coupled with the current sensing element to measure the voltage drop generated across the current sensing element when the current supply is activated; and,
- a memory that is not a transitory propagating signal, the memory connected to the processor and encoding computer readable instructions, including processor executable program instructions, the computer readable instructions accessible to the processor, wherein the processor executable program instructions, when executed by the processor, cause the processor to perform operations comprising:
  - sense current in the current sensing element;
  - correct inaccuracy measured in the sensed current; and,
  - measure the precise current sensed in the current sensing element with the measured inaccuracy corrected.

7. The apparatus of claim 6, in which the current sensing element further comprises a bond wire of an integrated circuit package.

8. The apparatus of claim 6, in which the current sensing element is configured on a printed circuit board, or on an integrated circuit package lead frame, or on an integrated circuit itself.

9. The apparatus of claim 6, in which the current sensing element further comprises:
- a plurality of connections, comprising: a first set of more than one connection configured to force current in the sensing element; and, a second set of more than one connection distinct from the first set of more than one connection, the second set of more than one connection configured to sense voltage drop across the sensing element.

10. The apparatus of claim 6, in which the current sensing element further comprises sensor signal conditioning circuitry configured to correct sensing element non-ideality over temperature, sensing current value, and variation in the sensing element material.

11. The apparatus of claim 6, in which the operations performed by the processor further comprise: measure, at a plurality of temperatures, the voltage drop generated by a current determined as a percentage of the current supply full scale current.

12. The apparatus of claim 6, in which the operations performed by the processor further comprise: calculate calibration coefficients determined as a function of the current sensed in the current sensing element.

13. An apparatus, comprising:
a precision current sensing system configured to accurately measure current in a current sense resistance, comprising:
- a current sensing element, comprising:
  - a low-cost non-precision current sense resistance; and,
  - sensor signal conditioning circuitry operably coupled with the low-cost non-precision current sense resistance, wherein the signal conditioning circuitry is configured to correct sensing element non-ideality over temperature, sensing current value, and variation in the sensing element material; and,
- a current supply connected in series with the low-cost non-precision current sense resistance;
- a processor, operably coupled with the current supply to govern the current supplied by the current supply; wherein, the processor is operably coupled with the low-cost non-precision current sense resistance to measure the voltage drop generated across the low-cost non-precision current sense resistance when the current supply is activated; and,
- a memory that is not a transitory propagating signal, the memory connected to the processor and encoding computer readable instructions, including processor executable program instructions, the computer readable instructions accessible to the processor, wherein the processor executable program instructions, when executed by the processor, cause the processor to perform operations comprising:
  - sense current in the low-cost non-precision current sense resistance, based on measuring the voltage drop generated by the current supply across the low-cost non-precision resistance when the current supply is activated;
  - correct inaccuracy measured in the sensed current, based on calculating calibration coefficients determined as a function of the current sensed in the low-cost non-precision resistance by measuring at a plurality of temperatures the voltage drop generated by a plurality of currents determined as percentages of the current supply full scale current; and,
  - measure the precise current sensed in the low-cost non-precision current sense resistance with the measured inaccuracy corrected.

14. The apparatus of claim 13, in which the low-cost non-precision current sense resistance further comprises a bond wire of an integrated circuit package.

15. The apparatus of claim 13, in which the plurality of currents further comprises a number of current values determined as a function of a sense resistor characteristic useful to compute a corrected current value proportional to the real value of the sensed current.

16. The apparatus of claim 13, in which the percentages of the current supply full scale current further comprises a percentage of the current supply full scale current determined as a function of a sense resistor characteristic useful to compute a corrected current value proportional to the real value of the sensed current.

17. The apparatus of claim 13, in which correct inaccuracy further comprises verify the correction of the sensed voltage of the low-cost non-precision current sense resistance over various values of the accurate forced current as well as over various temperatures.

18. The apparatus of claim 13, in which measure the precise current further comprises compute the precise current value as a function of the calculated calibration coefficients.

* * * * *